United States Patent [19]

Bird

[11] Patent Number: 4,941,050
[45] Date of Patent: Jul. 10, 1990

[54] AN AFC ARRANGEMENT FOR TUNING A TELEVISION RECEIVING APPARATUS TO A SELECT TRANSMISSION HAVING AN ACTUAL CARRIER FREQUENCY WHICH DIFFERS FROM A NOMINAL CARRIER FREQUENCY

[75] Inventor: Philip H. Bird, Sidcup, England

[73] Assignee: U.S. Philips Corporation, New York, N.Y.

[21] Appl. No.: 338,927

[22] Filed: Apr. 14, 1989

[30] Foreign Application Priority Data

Apr. 27, 1988 [GB] United Kingdom ............ 8809921

[51] Int. Cl.⁵ ............................................. H04N 5/50
[52] U.S. Cl. .............................. 358/195.1; 358/191.1; 455/164; 455/169
[58] Field of Search ............... 358/191.1, 195.1, 188; 455/169, 182, 192, 262, 164

[56] References Cited

U.S. PATENT DOCUMENTS

| | | | |
|---|---|---|---|
| 3,922,483 | 11/1975 | Indri | 358/195.1 |
| 3,968,441 | 7/1976 | Garskamp | 455/164 |
| 4,240,115 | 12/1980 | Kamiya | 358/195.1 |
| 4,281,348 | 7/1981 | Shizuya | 358/188 |
| 4,461,037 | 7/1984 | Itagaki | 455/169 |
| 4,594,611 | 6/1986 | Sugibayashi etal. | 358/191.1 |
| 4,814,887 | 3/1989 | Marz et al. | 358/195.1 |

FOREIGN PATENT DOCUMENTS

| | | |
|---|---|---|
| 0058551 | 5/1985 | European Pat. Off. . |
| 58-111522 | 7/1983 | Japan . |
| 62-84612 | 4/1987 | Japan . |
| 1482241 | 8/1977 | United Kingdom . |

Primary Examiner—John K. Peng
Attorney, Agent, or Firm—Edward W. Goodman

[57] ABSTRACT

A television receiver has an a.f.c. arrangement for ensuring the correct tuning of a tuner unit (4) which is tuned to the nominal carrier frequency by a tuning voltage (VT). When the tuner unit (4) is incorrectly tuned to the actual carrier frequency, the a.f.c. system operates in a first mode in which a sweep current produced by a current source (15) is applied by way of a closed switch (16) to an a.f.c. capacitor (17) to produce a swept a.f.c. voltage for the tuner unit (4). The sweep direction is controlled by an RS flip-flop (13) by way of a multiplexer (12) in response to voltage comparators (19, 20) connected to the a.f.c. capacitor (17). When the tuning is sufficiently close such that the received transmission can be correctly decoded, the a.f.c. arrangement goes into a second mode in which the output of a frequency demodulator (6) is applied via the multiplexer (12) to control the current source (15) and hence the voltage across a.f.c. capacitors (17). For this second mode gate pulses (G1, G2) from a processor (11) control the multiplexer (12) paths by a monostable (14) and only cause the switch (16) to be conductive during a given portion of each line period.

13 Claims, 2 Drawing Sheets

AN AFC ARRANGEMENT FOR TUNING A TELEVISION RECEIVING APPARATUS TO A SELECT TRANSMISSION HAVING AN ACTUAL CARRIER FREQUENCY WHICH DIFFERS FROM A NOMINAL CARRIER FREQUENCY

The present invention relates to receiving apparatus for a television signal where substantially all the line periods of a frame contain a first portion comprising at least synchronizing information and a second portion comprising vision information, said apparatus comprising a tuner unit for tuning said apparatus to a selected transmission, an automatic frequency control (a.f.c.) arrangement for ensuring the correct tuning of said tuner unit, a demodulator for demodulating the signal of the selected transmission when received, means for applying a preset tuning voltage to said tuner unit for setting the tuning of said tuner unit to or adjacent the nominal carrier frequency for said selected transmission, and means for applying an a.f.c. voltage from said a.f.c. arrangement to said tuner unit.

DESCRIPTION OF RELATED ART

Such apparatus is well known for receiving television signals, in particular terrestrial television transmissions, where the tuner unit directly operates at the frequencies of the transmissions as transmitted. In the case of television signals transmitted from a satellite in, say, the 12 GHz band as proposed for DBS (Direct Broadcast from Satellite) services, then received transmissions are down converted at the aerial in a LNB (low noise block) down converter to produce the transmission with a band, say, between 950 and 1750 MHz. As such down converters are normally mounted on the receiver aerial, they are subjected to the extremes of temperature experienced not only over a day but also over a year which can have an effect on the accuracy of operation as well as the inherent accuracy of the down converter itself. Thus a down converted transmission may not appear, at the input of the tuner unit, at the nominal frequency of coversion.

SUMMARY OF THE INVENTION

It is an object of the invention to provide apparatus having an automatic frequency control arrangement which can overcome the above problem.

The invention provides receiving apparatus for a television signal where substantially all the line periods of a frame contain a first portion comprising at least synchronizing information and a second portion comprising vision information, said apparatus comprising a tuner unit for tuning said apparatus to a selected transmission, an automatic frequency control (a.f.c.) arrangement for ensuring the correct tuning of said tuner unit, a demodulator for demodulating the signal of the selected transmission when received, means for applying a preset tuning voltage to said tuner unit for setting the tuning of said tuner unit to or adjacent the nominal carrier frequency for said selected transmission, and means for applying an a.f.c. voltage from said a.f.c. arrangement to said tuner unit for correctly tuning said tuner unit to the actual carrier frequency of said selected transmission, characterized in that said a.f.c. arrangement comprises first means for causing said arrangement to operate, in the event that said tuner unit is incorrectly tuned to said selected transmission, in a first mode in which the a.f.c. voltage is such that the tuning frequency of said tuner unit is swept about said nominal frequency over a range which is greater than the expected error between the actual and the nominal carrier frequency, said frequency sweep continuing until said tuner unit is tuned sufficiently closed to said actual carrier frequency that the selected transmission can be correctly decoded, whereafter second means are provided for causing said a.f.c. arrangement to operate in a second mode in which the a.f.c. voltage is derived from the output of said demodulator from said selected transmission during the first portion of the line periods.

The invention has the advantage that in the first mode, it can capture the selected transmission and that the tuner unit is accurately tuned in the second mode with information from the transmission.

The a.f.c. voltage may be produced across an a.f.c. capacitor when the first means of the a.f.c. arrangement comprises a current source whose output is continuously connected, in the first mode, to the a.f.c. capacitor, a bistable circuit coupled to the current source which in a first state causes the source to generate a current in a first direction and in a second state causes said source to generate current in a second opposite direction, and sensing means connected to the output of said current source for changing the state of said bistable circuit when the output of said source reaches an upper or a lower limit.

The a.f.c. voltage may also be produced across an a.f.c. capacitor when the second means of said a.f.c. arrangement comprises a current source whose input is connected to the output of said demodulator and whose output is connected to said a.f.c. capacitor via a switch which, in said second mode, is conducting only during the first portion of said line periods.

The current source may be common to the first and second means of said a.f.c. arrangement. While said switch may continuously conduct when said arrangement is in said first mode to provide the continuous connection between the current source and the a.f.c. capacitor.

The connection of the input of said current source either to said bistable circuit, in said first mode, or to said demodulator, in said second mode, may be by way of a multiplexer whose operation is controlled by the presence or absence of said correctly decoded transmission.

In the presence of said selected transmission, a gating pulse may be produced for substantially each line period, which pulse is applied to a monostable circuit to trigger it into its quasi-stable state which has a duration greater than a line period, the output of said monostable circuit being applied to said multiplexer to provide a path between the demodulator and the current source when the monostable circuit is in its quasi-stable state. The gating pulse may have a duration corresponding to that of the first portion of a line period which pulse is additionally applied to said switch to control its conductive periods.

The a.f.c. arrangement may revert from its second mode to its first mode if said selected transmission becomes incorrectly decoded, the direction of the frequency sweep being reversed on said reversion. Following the incorrect decoding of the selected transmission, said monstable circuit may revert to its stable state triggering a second monostable circuit into its quasi-stable state, the output of said second monostable circuit being applied to a further input of said bistable circuit to toggle it to its other state when said second monostable goes into its quasi-stable state.

BRIEF DESCRIPTION OF THE DRAWINGS

The above and other features of the invention will now be described, by way of example, with reference to the accompanying drawings in which.

DESCRIPTION OF THE PREFERRED EMBODIMENT

Figure 1:
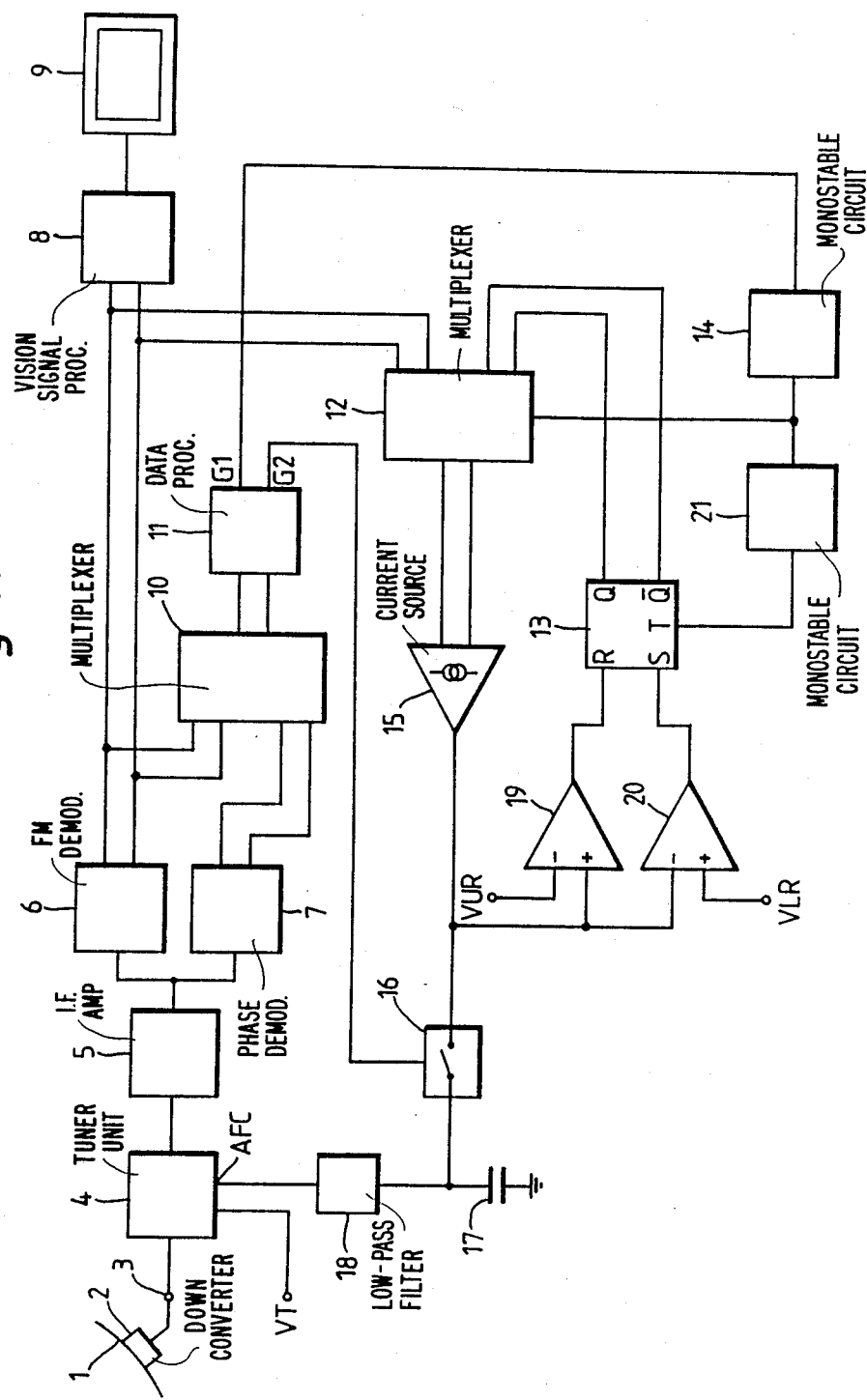
FIG. 1 is a block diagram of receiving apparatus according to the invention.

FIG. 1 diagrammatically shows a television receiver for satellite broadcast signals of the MAC/packet family as described in the European Broadcasting Union (EBU) document "Specification of the systems of MAC/packet family", Tech. 3258-E, Oct. 1986. A dish aerial 1 suitably dimensioned and orientated receives signals from a satellite transmitting in the 12 GHz band which are applied to a low noise block (LNB) down converter 2, to produce down converted signals in a frequency band of 950 to 1750 MHz. These down converted signals are applied, by way of an input 3 of the television receiver, to a tuner unit 4 in which frequency selection for particular transmissions takes place unit the control of a tuning voltage VT. The intermediate frequency output of the tuner unit 4, which is in the region of 450 MHz, is amplified in an I.F. amplifier 5 whose output is applied to an FM demodulator 6. If the received transmission is of the D or D2-MAC packet type, then the FM demodulator 6 will demodulate both the data burst and the vision components as both will be frequency modulated. However, if the received transmission is of the C-MAC packet type the vision components will be demodulated by the FM demodulator 6 while the data burst which is 2-4 PSK modulated will be demodulated by a phase demodulator 7 also connected to the output of IF amplifier 5. The demodulated output from the FM demodulator 6 is applied to a vision signal processor 8 where the time multiplexed vision components are descrambled, if the transmitted signal is scrambled, and reorganized into simultaneous luminance and chrominance components for display purposes. The output of the vision processor 8 is applied to a display device 9 which may be part of the receiver or separate therefrom.

The demodulated outputs of FM demodulator 6 and phase demodulator 7 are applied to a multiplexer 10 which selects the demodulated data from the appropriate demodulator according to the type of MAC packet signal being received. The selected output of multiplexer 10 is applied to a data processor 11 where the various sound and data components are decoded. Most of the outputs from the data processor 11 have been omitted. However, two such outputs are shown, these being G1 and G2 which represent gating pulses, the nature of which will be described hereafter.

The differential output of the FM demodulator 6 is additionally applied to a second multiplexer 12 which also receives the Q and $\bar{Q}$ outputs of an RS flip-flop 13. The multiplexer 12 is controlled by the output of a first monostable circuit 14, which is itself triggered by gating pulse output is G1 of the data processor 11, and the selected mutiplexed output applied, to an up/down current source 15. The output of this current source 15 is applied by way of a switch 16, which is controlled by gating pulse output G2 of the data processor 11, to an a.f.c. capacitor 17, the voltage across which is applied, by way of a low pass filter 18, to the a.f.c. input of tuner unit 4. The connection between current source 15 and switch 16 is also connected to a first (19) and a second (20) voltage comparator each in the form of a differential amplifier, the non-inverting (+) input of comparator 19 and the inverting (−) input of comparator 20 forming this connection while the inverting (−) input of comparator 19 is connected to an upper reference voltage VUR and the non-inverting (+) input of comparator 20 is connected to a lower reference voltage VLR. The outputs of comparators 19 and 20 are respectively connected to the reset R and set S inputs of flip-flop 13. A toggle input T of flip-flop 13 is connected to the output of a second monostable circuit 21 whose input is connected to the output of first monostable circuit 14.

The method in which the automatic frequency control circuit (a.f.c.) operates is as follows. At switch-on or when changing from one channel to another, the tuning voltage VT will tune the tuner unit 4 nominally to the frequency of the selected channel, but this may not be the actual frequency of the selected channel as received at the receiver input, which will depend upon the accuracy of the down converter 2 and the temperature to which it is currently subjected which can vary considerably over a day and over a year. It is assumed the difference in frequency is such that the carrier frequency of the received signal at input 3 is within ±3 MHz of the nominal carrier frequency of say 1.5 GHz. In the case of such incorrect tuning, gate pulses G1, whose length corresponds to that of the data burst in each television line, are not produced and the first monostable circuit 14 stays in its stable state causing multiplexer circuit 12 to connect the differential output of flip-flop 13 to the inputs of current source 15. Also in such a case, the gate output G2 of the data processor 11 remains in its 'high' state closing switch 16 and connecting a.f.c. capacitor 17 to the output of current source 15. The voltage present across capacitor 17, which is determined by the current output of current source 15, is applied to the appropriate inputs of voltage comparators 18 and 20 and if it is assumed that initially this voltage lies between the upper and lower reference voltages VUR, VLR, then the flip-flop 13 will remain in the state it was in at switch on or channel change. Current source 15 is an up/down current source so that for one output state of flip-flop 13 the current output of source 15 will increase while for the other output state of flip-flop 13 this current output will decrease. This produces a corresponding increase or decrease of the voltage across capacitor 17 which is transmitted to the voltage comparators 19 and 20 to produce a change in one of their outputs when the applied voltage coresponds to that of one or other of the reference voltages. The change in the output of the appropriate comparator causes a change of state of flip-flop 13 to produce a change in the direction of current generation by current source 15 and hence in the voltage across capacitor 17 which changes in a triangular manner at a frequency of say around 1 Hz depending on the time taken by data processor 11 to achieve synchronization. This triangular voltage is applied from the a.f.c. capacitor 17, by way of low pass filter 18 having a cut-off frequency below the 25 Hz dispersal frequency, tc the a.f.c. input of the tuner unit 4. The magnitude of the triangular a.f.c. voltage is sufficient to cause the tuning of the tuner unit 4 to swing ±5 MHz about the nominal frequency selected by the tuning voltage VT which is in excess of the anticipated frequency error given above.

At a given instant, the tuning of the tuner unit 4 is such that the received signal is effectively captured and the data processor 11 synchronizes to this incoming signal. Gating pulses whose duration is given above are then produced at the output G1 and at the same time, the output G2 provides the same gating pulses as at G1 resulting in switch 16 being closed only during the data burst period in each television line and open for the remainder of each line period. The gating pulses G1 are applied to the first re-triggerable monostable circuit 14 to trigger it into its quasi-stable state having a period of 40 msec. which is well in excess of the duration of a line period so that in the presence of a train of gating pulses G1 (or even in the absence of an odd gating pulse), the output of monostable 14 remains 'high'. This causes the multiplexer 12 to change its operation so that the differential output of FM demodulator 6 is connected to the differential inputs of the up/down current source 15 whose current output is then determined by the amplitude of the output from demodulator 6. The output of current source 15 will only be applied to capacitor 17 during the data burst periods when switch 16 is closed as it can be assumed that the data signals will contain equal numbers of binary 1's and 0's over a frame period whereas no assumption can be made with regard to the content of the vision components. Over the period given, the effects of energy dispersal will also average to zero. The a.f.c. voltage across capacitor 17 holds its level during the vision period of each line, which voltage is used to provide precise tuning in the tuner unit 4.

Figure 2:
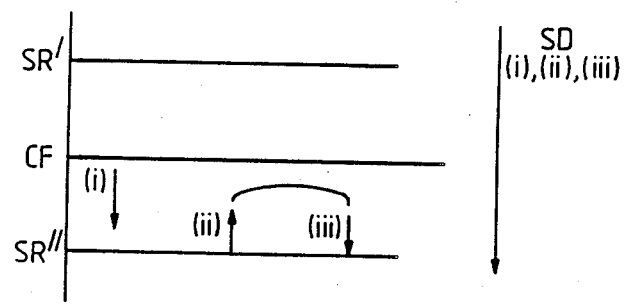
FIGS. 2a and 2b are diagrams explaining the operation of part of FIG. 1.
Figure 2:
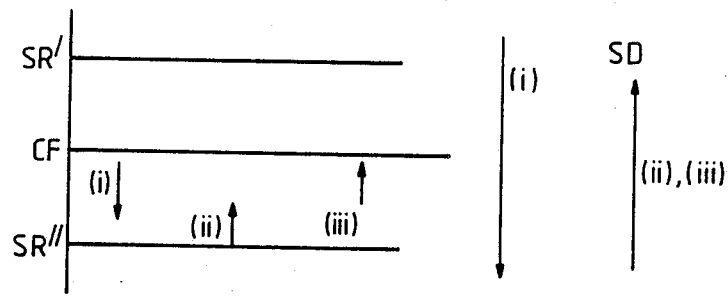

If the FM demodulator 6 is of the quadrature type then it is possible that the data processor 11 could synchronize while the receiver is tuned to a side response rather than the carrier frequency. Since the demodulated output would contain in this case the inverse of the data in the data burst, the data processor 11 can still go into lock as the line sync. word is inverted on alternate lines. However, the d.c. components of the differential outputs of the FM demodulator 6 tend to be different due to a quadrature demodulator's side response and the a.f.c. system goes out of lock. When this happens, the a.f.c. system reverts to its sweep mode and tries to move the tuning toward the correct frequency. FIG. 2a illustrates a problem that can occur when the data processor 11 locks onto a side response SR' or SR". It is assumed that the a.f.c. system comes out of lock from the center frequency CF while the sweep direction SD, as shown by the arrow (i), is towards the side response SR". The data processor 11 would then lock to the side response SR", but since the d.c. components of the differential outputs from the FM demodulator 6 would be different, the a.f.c. system tries to move the tuning back towards the center frequency CF as indicated by the arrow (ii) and the data processor 11 again loses synchronization. If the sweep direction SD set by the RS flip-flop 13 is still towards the side response SR" as indicated by the arrow (iii), then the system will go in and out of lock oscillating around the side response SR".

The above problem can be overcome in the manner to be described with reference to FIG. 2b. The loss of lock from the center frequency CF, locking onto the side response SR" and the attempt to move the tuning back to the center frequency CF illustrated by the arrows (i) and (ii) are as described for FIG. 2a. If when the system locks onto side response SR" the RS flip-flop 13 is toggled so as to change the sweep direction SD, when loss of lock of this side response SR" occurs, the sweep direction SD will be towards the center frequency CF and the a.f.c. system will move towards the correct frequency. This can be achieved by the second monostable circuit 21 of FIG. 1 which is triggered into its quasi-stable state each time the output of the first monostable circuit 14 returns to its stable state, i.e. each time the system loses lock. The short pulse output of the second monostable circuit 21 is applied to the toggle input T of RS flip-flop 13 to toggle it into its other state.

From reading the present disclosure, other modifications will be apparent to persons skilled in the art. Such modifications may involve other features which are already known in the design, manufacture and use of apparatus and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly of implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. Receiving apparatus for a television signal where substantially all the line periods of a frame contain a first portion comprising at least synchronizing information and a second portion comprising vision information, said apparatus comprising a tuner unit for tuning said apparatus to a selected transmission, an automatic frequency control (a.f.c.) arrangement for ensuring the correct tuning of said tuner unit, a demodulator for demodulating the signal of the selected transmission when received, means for applying a preset tuning voltage to said tuner unit for setting the tuning of said tuner unit to the nominal carrier frequency for said selected transmission, and means for applying an a.f.c. voltage from said a.f.c. arrangement to said tuner unit for correctly tuning said tuner unit to the actual carrier frequency of said selected transmission, characterized in that said a.f.c. arrangement comprises first means for causing said arrangement to operate, in the event that said tuner unit is incorrectly tuned to said selected transmission, in a first mode in which the a.f.c. voltage is such that the tuning frequency of said tuner unit is swept about said nominal frequency over a range which is greater than the expected error between the actual and the nominal carrier frequency, said frequency sweep continuing until said tuner unit is tuned sufficiently close to said actual carrier frequency that the selected transmission can be correctly decoded, whereafter second means are provided for causing said a.f.c. arrangement to operate in a second mode in which the a.f.c. voltage is derived from the output of said demodulator from said selected transmission during the first portion of the line periods, wherein said a.f.c. voltage is produced across an a.f.c. capacitor, and wherein the first means of said a.f.c. arrangement comprises a current source whose output is continuously connected, in said first mode, to said a.f.c. capacitor, a bistable circuit coupled to said current source which, in a first state, causes said source to generate a current in a first direction and, in a second state, causes said source to generate current in a second opposite direction, and sensing means connected to the output of said current source for changing the state of said bistable circuit when the current generated by said source reaches a first limit value in said first direction, and a second limit value in said second opposite direction.

2. Receiving apparatus as claimed in claim 1, characterized in that said a.f.c. arrangement reverts from its second mode to its first mode if said selected transmission becomes incorrectly decoded, the direction of the frequency sweep being reversed on said reversion.

3. Receiving apparatus for a television signal where substantially all the line periods of a frame contain a first portion comprising at least synchronizing information and a second portion comprising vision information, said apparatus comprising a tuner unit for tuning said apparatus to a selected transmission, an automatic frequency control (a.f.c.) arrangement for ensuring the correct tuning of said tuner unit, a demodulator for demodulating the signal of the selected transmission when received, means for applying a preset tuning voltage to said tuner unit for setting the tuning of said tuner unit to the nominal carrier frequency for said selected transmission, and means for applying an a.f.c. voltage from said a.f.c. arrangement to said tuner unit for correctly tuning said tuner unit to the actual carrier frequency of said selected transmission, characterized in that said a.f.c. arrangement comprises first means for causing said arrangement to operate, in the event that said tuner unit is incorrectly tuned to said selected transmission, in a first mode in which the a.f.c. voltage is such that the tuning frequency of said tuner unit is swept about said nominal frequency over a range which is greater than the expected error between the actual and the nominal carrier frequency, said frequency sweep continuing until said tuner unit is tuned sufficiently close to said actual carrier frequency that the selected transmission can be correctly decoded, whereafter second means are provided for causing said a.f.c. arrangement to operate in a second mode in which the a.f.c. voltage is derived from the output of said demodulator from said selected transmission during the first portion of the line periods, wherein said a.f.c. voltage is produced across an a.f.c. capacitor, and wherein the second means of said a.f.c. arrangement comprises a current source whose input is connected to the output of said demodulator and whose input is connected to said a.f.c. capacitor via a switch which, in said second mode, is conducting only during the first portion of said line periods.

4. Receiving apparatus as claimed in claim 3, characterized in that said a.f.c. arrangement reverts from its second mode to its first mode if said selected transmission becomes incorrectly decoded, the direction of the frequency sweep being reversed on said reversion.

5. Receiving apparatus for a television signal where substantially all the line periods of a frame contain a first portion comprising at least synchronizing information and a second portion comprising vision information, said apparatus comprising a tuner unit for tuning said apparatus to a selected transmission, an automatic frequency control (a.f.c.) arrangement for ensuring the correct tuning of said tuner unit, a demodulator for demodulating the signal of the selected transmission when received, means for applying a preset tuning voltage to said tuner unit for setting the tuning of said tuner unit to the nominal carrier frequency for said selected transmission, and means for applying an a.f.c. voltage from said a.f.c. arrangement to said tuner unit for correctly tuning said tuner unit to the actual carrier frequency of said selected transmission, characterized in that said a.f.c. arrangement comprises first means for causing said arrangement to operate, in the event that said tuner unit is incorrectly tuned to the actual carrier frequency of said selected transmission, in a first mode in which the a.f.c. voltage is varied such that the tuning frequency of said tuner unit is swept about said nominal frequency over a range which is greater than the expected error between the actual carrier frequency and the nominal carrier frequency, said frequency sweep continuing until said tuner unit is tuned sufficiently close to said actual carrier frequency that the selected transmission can be correctly decoded, whereafter, second means are provided for causing said a.f.c. arrangement to operate in a second mode in which the a.f.c. voltage is derived from an output of said demodulator demodulating said selected transmission during the first portion of the line periods, wherein said a.f.c. voltage is produced across an a.f.c. capacitor, and wherein the first means of said a.f.c. arrangement comprises a current source having an output continuously connected, in said first mode, by a switch to said a.f.c. capacitor, a bistable circuit having an output coupled to an input of said current source, said bistable circuit, in a first state, causing said current source to generate a current in a first direction and, in a second state, causing said current source to generate said current in a second opposite direction, and sensing means also connected to the output of said current source for changing the state of said bistable circuit when the current generated by said current source reaches a first limit value in said first direction and and when the current reaches a second limit value in said second opposite direction, and said second means comprises said output of said demodulator being coupled to said current source, said switch, in said second mode, connecting said current source to said a.f.c. capacitor only during the first portion of each line period, and wherein said a.f.c. arrangement further comprises means for selectively connecting the input of said current source to the output of said bistable circuit in said first mode, and to the output of said demodulator in said second mode.

6. Receiving apparatus as claimed in claim 5, characterized in that said a.f.c. arrangement reverts from its second mode to its first mode if said selected transmission becomes incorrectly decoded, the direction of the frequency sweep being reversed on said reversion.

7. Receiving apparatus as claimed in claim 5, characterized in that said connecting means comprises a multiplexer having inputs coupled to the outputs of said demodulator and said bistable circuit, respectively, and means for controlling said multiplexer to connect the output of said demodulator to the input of said current source in the presence of said correctly decoded transmission, and to connect the output of said bistable circuit to the input of said current source in the absence of said correctly decoded transmission.

8. Receiving apparatus as claimed in claim 7, characterized in that said a.f.c. arrangement reverts from its second mode to its first mode if said selected transmission becomes incorrectly decoded, the direction of the frequency sweep being reversed on said reversion.

9. Receiving apparatus as claimed in claim 7, characterized in that said receiving apparatus further comprises means for generating a gating pulse for each line period in the presence of said correctly decoded transmission, said gating pulse being applied to a monostable circuit to trigger it into its quasi-stable state which has a duration greater than a line period, the output of said monostable circuit being applied to said multiplexer to provide a path between the demodulator and the current source when the monostable circuit is in its quasi-stable state.

10. Receiving apparatus as claimed in claim 9, characterized in that said a.f.c. arrangement reverts from its second mode to its first mode if said selected transmission becomes incorrectly decoded, the direction of the frequency sweep being reversed on said reversion.

11. Receiving apparatus as claimed in claim 9, characterized in that said gating pulse has a duration corresponding to that of the first portion of a line period, and said generating means generates a further gating pulse, corresponding to said gating pulse, which is applied to said switch to control its conductive periods.

12. Receiving apparatus as claimed in claims 4, characterized in that said a.f.c. arrangement reverts from its second mode to its first mode if said selected transmission becomes incorrectly decoded, the direction of the frequency sweep being reversed on said reversion.

13. Receiving apparatus as claimed in claim 2, characterized in that following the incorrect decoding of the selected transmission, said monstable circuit reverts to its stable state triggering a second monostable circuit into its quasi-stable state, the output of said second monostable circuit being applied to a further input of said bistable circuit to toggle it to its other state when said second monostable circuit goes into its quasi-stable state.

* * * * *